United States Patent
Xiao

(10) Patent No.: US 9,136,183 B2
(45) Date of Patent: Sep. 15, 2015

(54) TRANSISTOR DEVICE AND FABRICATION METHOD

(71) Applicant: Semiconductor Manufacturing International (Shanghai) Corporation, Shanghai (CN)

(72) Inventor: De Yuan Xiao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/143,623

(22) Filed: Dec. 30, 2013

(65) Prior Publication Data

US 2014/0193956 A1   Jul. 10, 2014

(30) Foreign Application Priority Data

Jan. 8, 2013   (CN) .......................... 2013 1 0006388

(51) Int. Cl.
| | |
|---|---|
| *H01L 21/8238* | (2006.01) |
| *H01L 21/8252* | (2006.01) |
| *H01L 21/8258* | (2006.01) |
| *H01L 29/78* | (2006.01) |
| *H01L 29/06* | (2006.01) |
| *H01L 29/10* | (2006.01) |
| *H01L 29/165* | (2006.01) |

(52) U.S. Cl.
CPC .... *H01L 21/823878* (2013.01); *H01L 21/8252* (2013.01); *H01L 21/8258* (2013.01); *H01L 29/0653* (2013.01); *H01L 29/1054* (2013.01); *H01L 29/1083* (2013.01); *H01L 29/7838* (2013.01); *H01L 29/165* (2013.01)

(58) Field of Classification Search
CPC ................... H01L 29/0649; H01L 21/823878; H01L 21/8258; H01L 21/8252; H01L 29/7838; H01L 29/1083; H01L 29/0653; H01L 29/165
USPC ............. 365/185.17; 438/224, 285, 291, 430; 257/2, 192, 319
See application file for complete search history.

(56) References Cited

U.S. PATENT DOCUMENTS

| | | | |
|---|---|---|---|
| 2009/0236595 A1* | 9/2009 | Atanackovic | 257/43 |
| 2010/0276662 A1* | 11/2010 | Colinge | 257/9 |
| 2011/0053341 A1* | 3/2011 | Kakoschke et al. | 438/430 |
| 2011/0280076 A1* | 11/2011 | Samachisa et al. | 365/185.17 |
| 2012/0025267 A1* | 2/2012 | Huang et al. | 257/192 |
| 2012/0267685 A1* | 10/2012 | Cheng et al. | 257/192 |
| 2013/0037889 A1* | 2/2013 | Liao et al. | 257/411 |
| 2013/0078777 A1* | 3/2013 | Cheng et al. | 438/291 |

* cited by examiner

*Primary Examiner* — Brett Feeney
*Assistant Examiner* — James Chin
(74) *Attorney, Agent, or Firm* — Anova Law Group, PLLC

(57) ABSTRACT

Fabrication methods for junctionless transistor and complementary junctionless transistor. An isolation layer doped with a first-type ion is formed on a semiconductor substrate and an active layer doped with a second-type ion is formed on the isolation layer. The active layer includes a first portion between a second portion and a third portion of the active layer. Portions of the isolation layer under the second and third portions of the active layer are removed to suspend the second and third portions of the active layer. A gate structure is formed on the first portion of the active layer. A source and a drain are formed by doping the second portion and the third portion of the active layer with the second-type ion on both sides of the gate structure. The source and the drain have a same doping type as the first portion of the active layer.

9 Claims, 5 Drawing Sheets

TRANSISTOR DEVICE AND FABRICATION METHOD

CROSS-REFERENCES TO RELATED APPLICATIONS

This application claims priority to Chinese Patent Application No. CN201310006388.1, filed on Jan. 8, 2013, the entire contents of which are incorporated herein by reference.

FIELD OF THE DISCLOSURE

The present disclosure relates to the field of semiconductor technology and, more particularly, relates to junctionless transistors and complementary junctionless transistors (CJLTs) and their fabrication methods.

BACKGROUND

With development of semiconductor technologies, process nodes (critical dimensions) become smaller and demands for materials become higher. For a conventional field effect transistor (FET), source and drain regions can have different doping types and concentrations from channel region, and PN junctions can be formed between the source and the channel or the drain and the channel. As the size of devices shrinks, effects such as shifts of threshold voltage and elevations of leakage current may affect device performance. In some cases, device structures such as silicon-on-insulator, dual-gate, triple-gate, and ring-gate have been used to suppress short-channel and other adverse effects.

Since the device has continually been scaled down in size, areas of source, drain, and channel regions become smaller, control of doping process becomes more challenging, and formation of PN junctions between source and channel or drain and channel becomes more difficult. To overcome problems including sudden change of doping type and concentration, junctionless transistor having source, drain and channel regions of the same doping type has been developed. Meanwhile, junctionless transistor can suppress short-channel effect, and can operate even when the critical dimension (CD) has been scaled down to a few nanometers.

A junctionless transistor having a homogeneous material as substrate may have high source-drain parasitic capacitance in regions surrounding source and drain, which can seriously affect performance of the junctionless transistor. A junctionless transistor having a silicon-on-insulator (SOI) substrate can have reduced parasitic capacitance between the source and the substrate or between the drain and the substrate. However, manufacturing cost of SOI substrate with small CDs can be very high. In addition, buried layers in the SOI substrate may have low thermal conductivity, thus heat generated in channel region may not be released as desired. This may cause overheating to affect the performance of the junctionless transistor.

BRIEF SUMMARY OF THE DISCLOSURE

One aspect or embodiments of the present disclosure includes a method for forming a junctionless transistor. In this method, a semiconductor substrate is provided, and a first-type doped well is formed in the semiconductor substrate. An isolation layer doped with a first-type ion is formed on the semiconductor substrate and an active layer doped with a second-type ion is formed on the isolation layer. The active layer includes a first portion between a second portion and a third portion of the active layer. Portions of the isolation layer under the second and third portions of the active layer are removed to suspend the second and third portions of the active layer. A dielectric layer is formed between the semiconductor substrate and the active layer and has a same thickness of the isolation layer. A gate structure is formed on the first portion of the active layer. A source and a drain are formed by doping the second portion and the third portion of the active layer with the second-type ion on both sides of the gate structure. The source and the drain have a same doping type as the first portion of the active layer.

Another aspect or embodiments of the present disclosure includes a method for forming a complementary junctionless transistor device. A semiconductor substrate is provided including an NFET (N-field-effect transistor) portion and a PFET portion neighboring with each other having an interface portion. An isolation layer is formed on the semiconductor substrate and an active layer is formed on the isolation layer. A P-well is formed in the NFET portion of the semiconductor substrate, and an N-well is formed in the PFET portion of the semiconductor substrate. A P-doped isolation layer is formed by doping a portion of the isolation layer on the NFET portion. An N-doped isolation layer is formed by doping a portion of the isolation layer on the NFET portion. An N-doped active layer is formed by doping a portion of the active layer on the P-doped isolation layer, and a P-doped active layer is formed by doping a portion of the active layer on the N-doped isolation layer. The active layer and the isolation layer are etched to form an opening to expose a surface of the semiconductor substrate covering the interface portion between the NFET portion and PFET portion. A portion of the P-doped isolation layer is removed to suspend the N-doped active layer from opposing ends of the N-doped active layer, and a portion of the N-doped isolation layer is removed to suspend the P-doped active layer from opposing ends of the P-doped active layer. A dielectric layer is formed between the N-doped active layer and the semiconductor substrate, between the P-doped active layer and the semiconductor substrate, and in the opening. A first gate structure is formed on the N-doped active layer disposed on a remaining P-doped isolation layer, a second gate structure is formed on the P-doped active layer disposed on a remaining N-doped isolation layer. An N-doped source and an N-doped drain are formed in the N-doped active layer on both sides of the first gate structure, and a P-doped source and a P-doped drain are formed in the P-doped active layer on both sides of the second gate structure.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Junctionless transistors may have large source-drain parasite capacitance and low thermal stability, which may affect the performance of the junctionless transistor. FIGS. 1-14 depict structures of junctionless transistors and CJLT transistors, and methods of their formation.

Figure 1:
FIGS. 1-7 are schematics of cross-sectional views of an exemplary junctionless transistor at various stages during its formation in accordance with various disclosed embodiments.

Referring to FIG. 1, in one embodiment, there is provided a semiconductor substrate 100. The semiconductor substrate 100 can be made of a semiconductor material including, e.g., silicon, germanium, silicon germanium, and/or gallium arsenide. In one embodiment, the semiconductor substrate 100 can be a P-type silicon wafer (or silicon chip).

Figure 2:
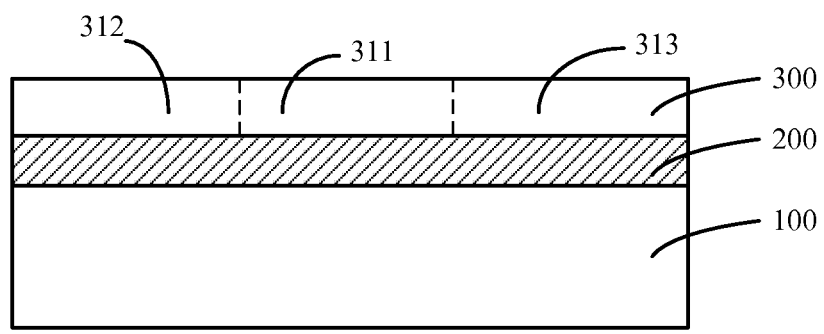

Referring to FIG. 2, an isolation layer 200 can be formed on the semiconductor substrate 100, and an active layer 300 can be formed subsequently on the isolation layer 200.

The isolation layer 200 can be made of a semiconductor material, and the material of the isolation layer 200 can be different from the material of the semiconductor substrate 100. In one embodiment, the isolation layer 200 can be made of SiGe.

The active layer 300 can be made of a material including, e.g., Si, Ge, and/or other III-V group compound. In addition, the material of the isolation layer 200 can be different from the material of the active layer 300. The isolation layer 200 can have a higher etch selectivity than the active layer 300. In one embodiment, the active layer 300 can be made of Si. The active layer 300 can include a first portion 311 in the middle of the active layer 300, and a second portion 312 and a third portion 313 disposed on both sides of the first portion 311. The first portion 311 can later become the channel region of a junctionless transistor, and the second portion 312 and the third portion 313 can later become the source and drain of a junctionless transistor, respectively.

In certain embodiments, the isolation layer 200 and the active layer 300 can be formed by epitaxial growing process.

Figure 3:
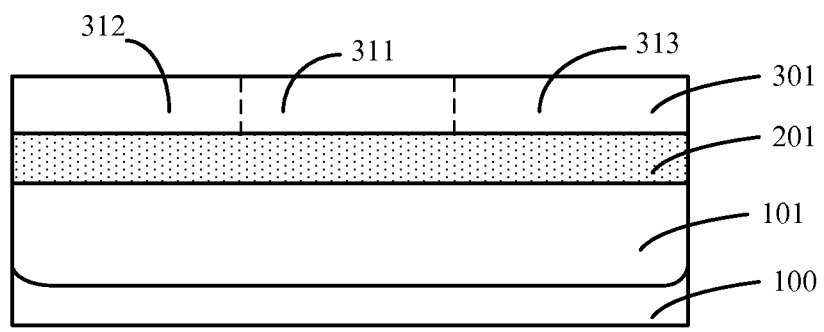

Referring to FIG. 3, a first-type doped well 101 can be formed in the semiconductor substrate 100. The isolation layer 200 (see FIG. 2) can be first-type doped to form a first-type doped isolation layer 201. The active layer 300 (see FIG. 2) can be second-type doped to form a second-type doped active layer 301.

The first-type doped well 101 can be either an N-well or a P-well. The first-type doped isolation layer 201 and the first-type doped well 101 can have the same doping type. The second-type doped active layer 301 and the first-type doped isolation layer 201 can have opposite doping types.

In one embodiment, the first-type doped well 101 can be a P-well, the first-type doped isolation layer 201 can be a P-type isolation layer, the second-type doped active layer 301 can be an N-type active layer, and the subsequently formed junctionless transistor can be an N-type junctionless transistor.

In another embodiment, the first-type doped well 101 can be an N-well, the first-type doped isolation layer 201 can be an N-type isolation layer, the second-type doped active layer 301 can be a P-type active layer, and the subsequently formed junctionless transistor can be a P-type junctionless transistor.

Plasma implantation can be used to form the first-type doped well 101 in the semiconductor substrate 100, the first-type doped isolation layer 200 (see FIG. 2), and the second-type doped active layer 300 (see FIG. 2).

In other embodiments, the semiconductor substrate 100 can first be plasma implanted to form a first-type doped well 101 in the semiconductor substrate 100, and then, the first-type doped isolation layer 201 and the second-type doped active layer 301 can be formed on the semiconductor substrate 100.

In certain embodiments, in situ doping process can be used to form the first-type doped isolation layer 201 by doping the isolation layer simultaneously during its epitaxial growing process. Similarly, in situ doping process can be used to form the second-type doped active layer 301 by simultaneously doping the epitaxial growing active layer.

Figure 4:
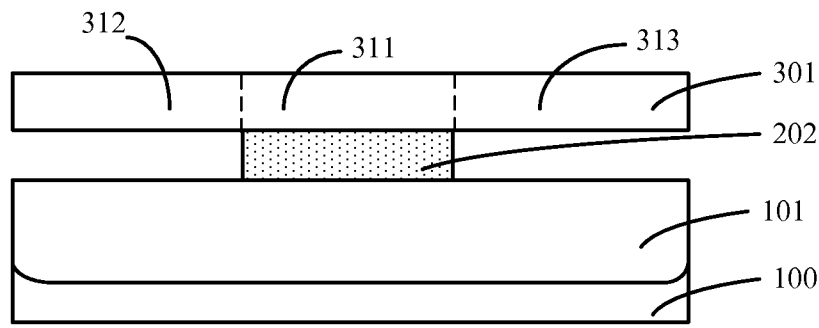

Referring to FIG. 4, the regions of the first-type doped isolation layer beneath the second portion 312 of the second-type doped active layer 301 and the third portion 313 of the second-type doped active layer 301 can be removed so that the second portion 312 and the third portion 313 of the second-type doped active layer 301 can be suspended.

Specifically, the method for making the second portion 312 and the third portion 313 of the second-type doped active layer 301 suspended can include: forming a photoresist layer (not shown) on the first portion 311 of the second-type doped active layer 301; using selective etching to etch the first-type doped isolation layer 201 inward from both sides of the first-type doped isolation layer 201 until the side-walls of the remaining first-type doped isolation layer 202 are aligned with the side-walls of the photoresist layer, or until the side-walls of the remaining first-type doped isolation layer 202 are disposed within the side-walls of the photoresist layer. As a result, the remaining first-type doped isolation layer 202 can be disposed underneath the first portion 311 of the second-type doped active layer 301, and the second portion 312 and the third portion 313 on both sides of the first portion 311 of the second-type doped active layer 301 can be suspended.

In one embodiment, the selective etching method can be a chemical vapor etching process. Specifically, the chemical vapor etching process can be carried out in a dry etching reaction chamber with a temperature ranging from about 300° C. to about 800° C. A mixture of $H_2$ and HCl can be used as etching gas, wherein the HCl can have a partial pressure ranging from about 300 Torr to about 500 Torr.

In other embodiments, the width of the remaining first-type doped isolation layer 202 can be shorter than that of the first portion 311 of the second-type doped active layer 301, and the portions on both sides of the first portion 311 (i.e. the second portion 312 and the third portion 313) can be suspended.

Figure 5:
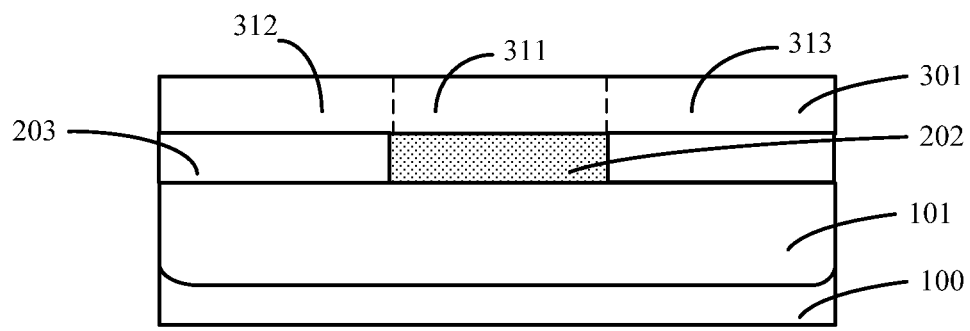

Referring to FIG. 5, a dielectric layer 203 can be formed between the semiconductor substrate 100 and the second-type doped active layer 301. The thickness of the dielectric layer 203 can equal the height of the remaining first-type doped isolation layer 202.

Specifically, the dielectric layer 203 can be made of a material including, e.g., silicon oxide, silicon nitride, boron-doped glass, phosphorus-doped glass, and/or boron- and phosphorus-doped glass. In one embodiment, chemical vapor deposition process can be used. The reaction gases used in the chemical vapor deposition process can fill the space between the second-type doped active layer 301 and the semiconductor substrate 100, and react to form the dielectric layer 203. Further, chemical mechanical polishing can be used to remove the dielectric material on the surface of the second-type doped active layer 301. In other embodiments, chemical vapor deposition (CVD) process may also be used. In this case, liquid filling material can fill the space between the second-type doped active layer 301 and the semiconductor substrate 100, react at high temperature, and solidify to form the dielectric layer 203.

The dielectric layer 203 can isolate the semiconductor substrate 100 from the second portion 312 of the second-type doped active layer 301, and from the third portion 313 of the second-type doped active layer 301, thereby reducing the parasite capacitance between the second portion 312 and the semiconductor substrate 100, or the third portion 313 and the semiconductor substrate 100.

Figure 6:
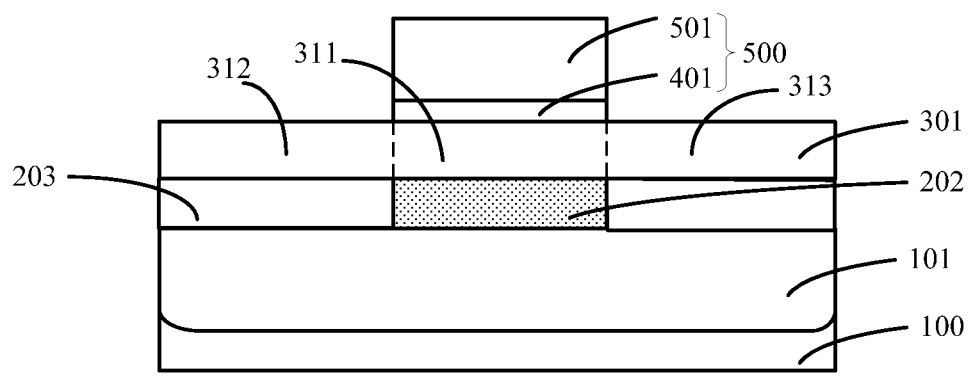

Referring to FIG. 6, a gate structure 500 can be formed on the first portion 311 of the second-type doped active layer 301.

The gate structure 500 can include a gate dielectric layer 401 disposed on the second-type doped active layer 301 and a gate electrode 501 disposed on the gate dielectric layer 401. The gate dielectric layer 401 can be made of a material including, e.g., silicon oxide, silicon nitride oxide, and/or a high-K dielectric material. The gate electrode 501 can be made of a material including, e.g., polysilicon and/or metal(s), wherein the metal (s) can be Ti, Co, Ni, Al, and/or W.

In one embodiment, the gate dielectric layer 401 can be made of a high-K dielectric material, and the gate electrode 501 can be made of a metal.

In other embodiments, after the gate structure 500 has been formed, sidewalls (not shown) on both sides of the gate structure 500 may also be formed. The sidewalls can protect the gate structure 500 during subsequent formation of the source and drain electrodes.

Figure 7:
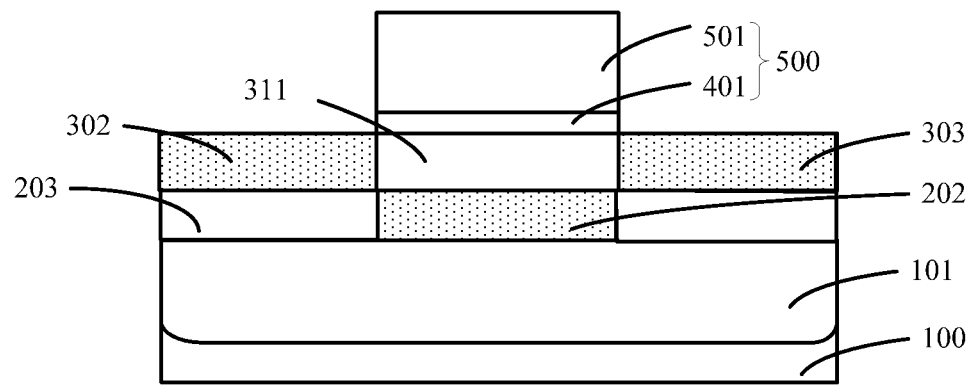

Referring to FIG. 7, the second portion 312 and the third portion 313 of the second-type doped active layer 301 (see FIG. 6) on both sides of the gate structure 500 can be second-type doped to form a source 302 and a drain 303.

Specifically, using the gate structure 500 as a mask, the second portion 312 and the third portion 313 of the second-type doped active layer 301 on both sides of the gate structure 500 can be second-type plasma implanted so that both the second portion 312 and the third portion 313 can have higher doping concentrations than the first portion 311. The source 302 and drain 303 can have doping concentrations higher than $2E19$ atoms/cm$^2$.

The dielectric layer 203 disposed under the source 302 and drain 303 can isolate the semiconductor substrate 100 from the source 302 and from drain 303, thereby effectively reducing the parasite capacitances of the source 302 and drain 303. The first portion 311 of the second-type doped active layer 301 beneath the gate structure 500 can be the channel region of a junctionless transistor. The second-type doped first portion 311 and the underlying remaining first-type doped isolation layer 202 can form a PN junction, thereby providing an electrical isolation between the first portion 311 and the semiconductor substrate 100.

In one embodiment, the first-type doping can be P-type, and the second-type doping can be N-type. Thus, the semiconductor substrate 100 can have a P-type doped well 101, the remaining first-type doped isolation layer 202 can be a P-type doped isolation layer, the first portion 311, source 302 and drain 303 can all have N-type doping. The junctionless transistor fabricated accordingly can be an N-type junctionless transistor.

In one embodiment, the junctionless transistor can be N-type and the work function of the gate electrode 501 may be adjusted so that when applied gate voltage is 0, the first portion 311 can have a full depletion of electrons, or even have an opposite polarity. In this case, the first portion 311 may not have carriers, or the carrier type is opposite to the source-drain doping type, thus the N-type junctionless transistor will be in an OFF state. When applied gate voltage is positive and the applied positive gate voltage reaches certain value, the first portion 311 can have an accumulation of the number of electrons and an increased concentration of the electrons. In this case, since the source 302 and drain 303 are also N-type doped, the N-type junctionless transistor will be in an ON state. This N-type junctionless transistor can have a threshold voltage greater than 0, and it is an enhancement transistor.

In other embodiments, the junctionless transistor can be N-type and the work function of the gate electrode 501 may also be adjusted so that when the applied gate voltage is 0, the first portion 311 may not have a full depletion of electrons. In this case, the first portion 311 may still have numerous electrons as major carriers, thus the N-type junctionless transistor will be in an ON state. When applied gate voltage is certain negative value, the first portion 311 can have increased number of holes so that the first portion 311 can have a full depletion of electrons, or even have an opposite polarity. In this case, the first portion 311 may not have carriers, or the major carrier type may be opposite to the source-drain doping type, thus the N-type junctionless transistor will be in an OFF state. This N-type junctionless transistor can have a threshold voltage less than 0, and it is a depletion type transistor.

In other embodiments, the first-type doping can be N-type, and the second-type doping can be P-type. Thus, the semiconductor substrate 100 can have N-type doped well 101, the remaining first-type doped isolation layer 202 can be an N-type doped isolation layer, the first portion 311, source 302 and drain 303 can all be P-type doped. The junctionless transistor fabricated accordingly is a P-type junctionless transistor.

In other embodiments, the junctionless transistor can be P-type and the work function of the gate electrode 501 may be adjusted so that when the applied gate voltage is 0, the first portion 311 may not have a full depletion of holes. In this case, the first portion 311 may still have numerous holes as major carriers, thus the P-type junctionless transistor will be in an ON state. When certain positive voltage is applied to the gate, the first portion 311 can have an increased number of electrons and the first portion 311 can have a full depletion of holes, or even have an opposite polarity. In this case, the first portion 311 may not have carriers, or the major carrier type may be opposite to the source-drain doping type, thus the P-type junctionless transistor will be in an OFF state. This P-type junctionless transistor can have a threshold voltage less than 0, and it is an enhancement transistor.

In other embodiments, the junctionless transistor can be P-type and the work function of the gate electrode 501 may also be adjusted so that when the applied gate voltage is 0, the first portion 311 can have a full depletion of holes, or even have an opposite polarity. In this case, the first portion 311 may not have carriers or the carrier type is opposite to the source-drain doping type, thus the P-type junctionless transistor will be in an OFF state. When certain negative voltage is applied to the gate, the first portion 311 can have an accumulation of holes and an increased concentration of holes. In this case, since the source 302 and drain 303 are also P-type doped, the P-type junctionless transistor will be in an ON state. This P-type junctionless transistor can have a threshold voltage greater than 0, and it is a depletion type transistor.

In some other embodiments, CJLT (complementary junctionless transistor) can be formed in accordance with various disclosed embodiments.

Figure 8:
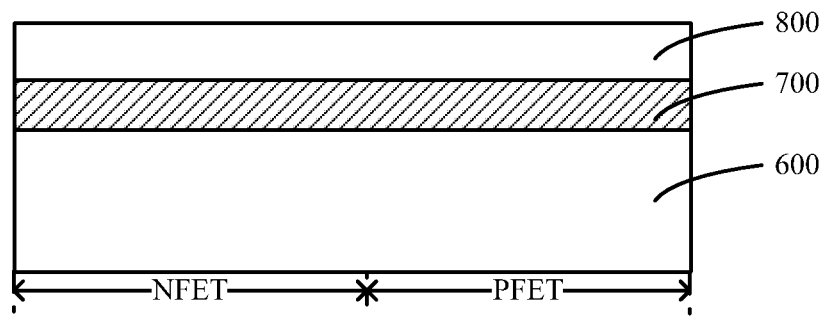
FIGS. 8-14 are schematics of cross-sectional views of an exemplary complementary junctionless transistor at various stages during its formation in accordance with various disclosed embodiments.

Referring to FIG. 8, there is provided a semiconductor substrate 600, wherein the semiconductor substrate 600 can have a PFET portion and an NFET portion. An isolation layer 700 can be formed on the semiconductor substrate 600 and an active layer 800 can be formed on the isolation layer 700.

The semiconductor substrate 600 can be made of a semiconductor material including, e.g., silicon, germanium, silicon germanium, and/or gallium arsenide. In one embodiment, the semiconductor substrate 600 can be made of a P-type silicon piece.

The isolation layer 700 can be made of a semiconductor material, and the material of the isolation layer 700 can be different from the material of the semiconductor substrate 600. In one embodiment, the isolation layer 700 can be made of SiGe.

The active layer 800 can be made of a material including, e.g., Si, Ge, and/or other III-V group compound, and the material of the active layer 800 can be different from the material of the isolation layer 700. The isolation layer 700 can have a higher etching selectivity than the active layer 800 or the semiconductor substrate 600.

In one embodiment, the isolation layer 700 and the active layer 800 can be formed by epitaxial growing process.

Figure 9:
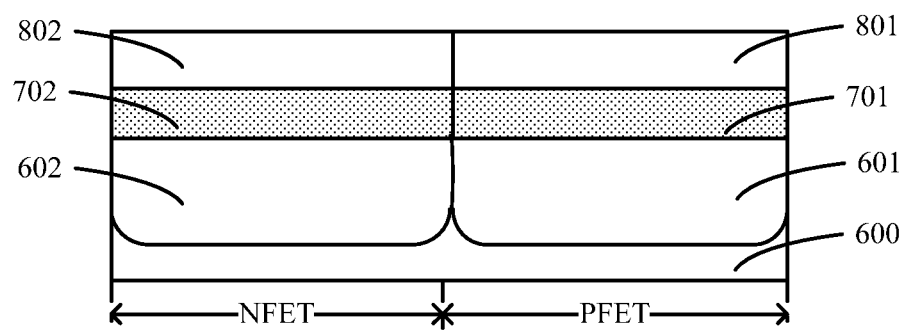

Referring to FIG. 9, a P-well 602 can be formed within the NFET portion of the semiconductor substrate 600, and an N-well can be formed within the PFET portion of the semiconductor substrate 600. A portion of the isolation layer on the NFET portion can be P-doped to form a P-type second isolation layer 702. A portion of the isolation layer on the PFET portion can be N-doped to form an N-type second isolation layer 701. A portion of the active layer on the P-doped isolation layer 702 can be N-type doped to form an N-type second active layer 802. A portion of the active layer on the N-type isolation layer 701 can be P-doped to form a P-type second active layer 801.

In one embodiment, plasma implantation can be used to form the P-well 602, the N-well 601, the second isolation layer 702, the first isolation layer 701, the second active layer 802, and the first active layer 801.

Figure 10:
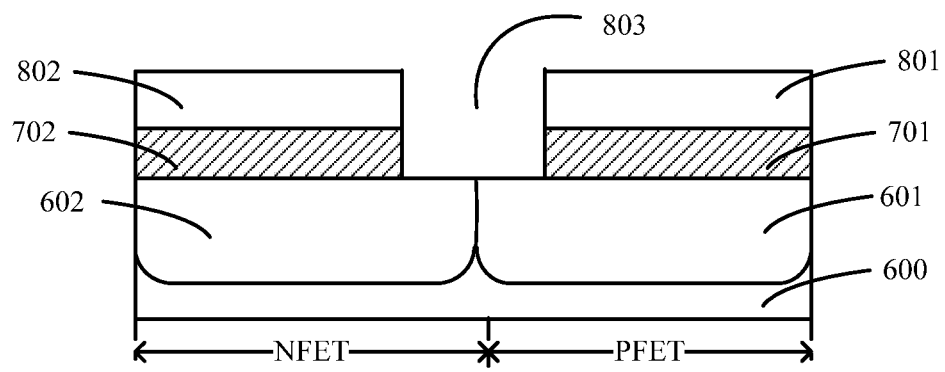

Referring to FIG. 10, the semiconductor substrate 600 can have an opening 803. The opening 803 can expose a surface area of the adjacent regions of the NFET portion 602 and the PFET portion 601 of the semiconductor substrate 600.

Specifically, formation of the opening 803 can include: forming a photoresist layer (not shown) on the second active layer 802 and the first active layer 801 and exposing the adjacent surface areas of the second active layer 802 and first active layer 801 from the photoresist layer; using the photoresist layer as mask to etch down, via a dry etch process, the exposed second active layer 802 and first active layer 801, as well as the underlying regions of the second isolation layer 702 and the first isolation layer 701 until the surface of the substrate (i.e., etching stop layer) has been reached. Subsequently, an N-type and P-type junctionless transistor can be formed respectively on the second active layer 802 and the first active layer 801.

Figure 11:
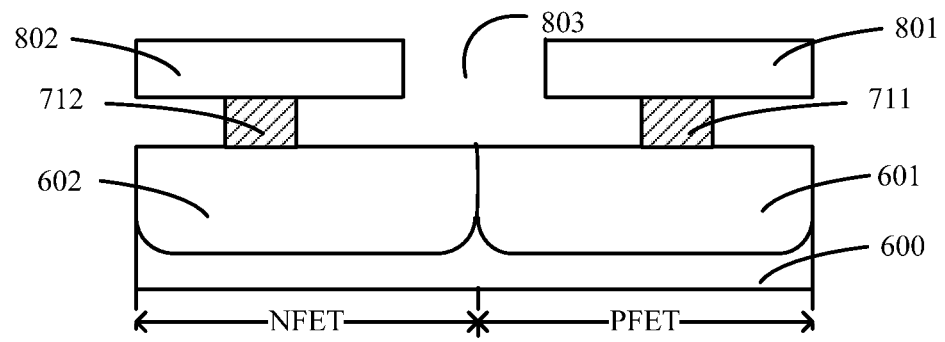

Referring to FIG. 11, part of the second isolation layer 702 (see FIG. 10) and part of the first isolation layer 701 (see FIG. 10) can be removed to form a third isolation layer 712 and a forth isolation layer 711, respectively. As a result, the two ends of the second active layer 802 are suspended, and the two ends of the first active layer 801 are also suspended.

Specifically, formation of the third isolation layer 712 and the forth isolation layer 711 can include: forming a photoresist layer on the first active layer 801 and the second active layer 802; covering the subsequent channel regions of the first active layer 801 and the second active layer 802 with the photoresist layer; using selective etching to etch the first isolation layer 701 (see FIG. 10) from both sides and the second isolation layer 702 (see FIG. 10) from both sides until the sidewalls of the remaining first or second isolation layers are aligned with or within the sidewalls of the above photoresist layer, thereby forming a third isolation layer 712 and a forth isolation layer 711. The third isolation layer 712 and the forth isolation layer 711 can be disposed right below the channel regions of the second active layer 802 and the first active layer 801, respectively.

Figure 12:
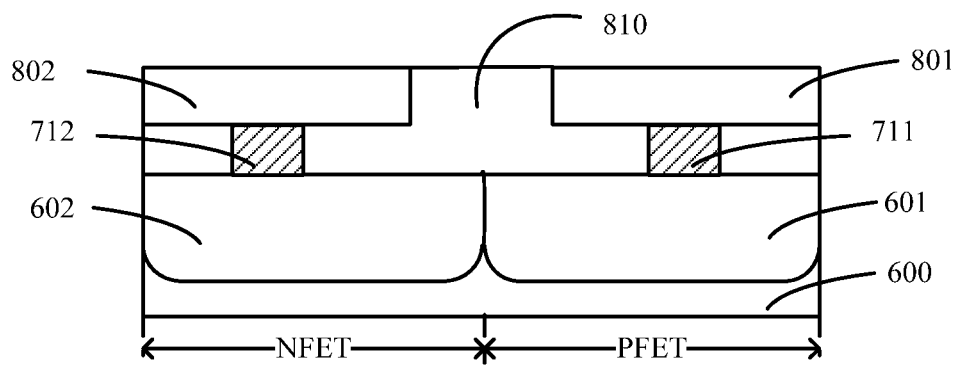

Referring to FIG. 12, a dielectric layer 810 can be formed on the semiconductor substrate 600, and the dielectric layer 810 can fill the opening 803 (see FIG. 11).

Specifically, the dielectric layer 810 can be made of a material including, e.g., silicon oxide, silicon nitride, boron-doped glass, phosphorus-doped glass, and/or boron- and phosphorus-doped glass. In one embodiment, chemical vapor deposition can be used to form the dielectric layer 810. Further, chemical mechanical polishing can be used to remove the dielectric material disposed on the first active layer 801 and the second active layer 802, so that the surface of the dielectric layer 810 can be flush with the surfaces of the first active layer 801 and the second active layer 802.

The dielectric layer 810 can separate the two ends of the first active layer 801 and the second active layer 802 with the semiconductor substrate 600, thereby reducing the parasite capacitance at the two ends of the first active layer 801 and the second active layer 802.

Figure 13:
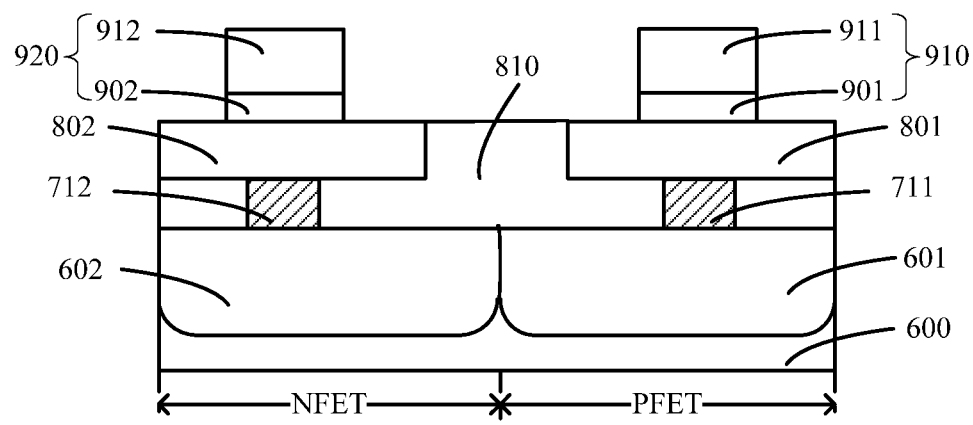

Referring to FIG. 13, a first gate structure 910 can be formed on the first active layer 801 and a second gate structure 920 can be formed on the second active layer 802.

The first gate structure 910 can be disposed right above the first isolation layer 711. The first gate structure 910 can include a first gate dielectric layer 901 disposed on the first active layer 801 and a first gate electrode 911 disposed on the first gate dielectric layer 901. The first gate dielectric layer 901 can be made of a material including, e.g., silicon oxide, silicon nitride oxide, and/or a high-K dielectric material. The first gate electrode 911 can be made of a material including, e.g., polysilicon, and/or metal(s), wherein the metal(s) can be Ti, Co, Ni, Al, and/or W.

The second gate structure 920 can be disposed right above the second isolation layer 712. The second gate structure 920 can include a second gate dielectric layer 902 disposed on the second active layer 802 and a second gate electrode 912 disposed on the second gate dielectric layer 902. The second gate dielectric layer 902 can be made of a material including, e.g., silicon oxide, silicon nitride oxide, and/or a high-K dielectric material. The second gate electrode 912 can be made of a material including, e.g., polysilicon, and/or metal (s), wherein the metal(s) can be Ti, Co, Ni, Al, and/or W.

Figure 14:
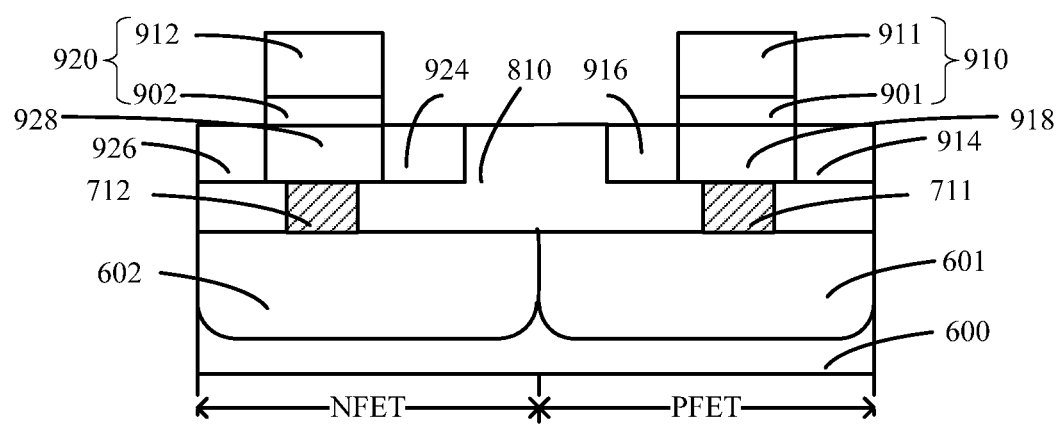

Referring to FIG. 14, a P-doped first source 914 and a P-doped first drain 916 can be formed within the first active layer (see FIG. 13) on both sides of the first gate structure 910; an N-doped second source 924 and an N-doped second drain 926 can be formed within the second active layer (see FIG.13) on both sides of the second gate structure 920.

Plasma implantation can be used to form the first source 914, the first drain 916, the second source 924, and the second drain 926. A portion of the first active layer right below the first gate structure 910 can be the first channel region 918; a portion of the second active layer right below the second gate structure 920 can be the second channel region 928.

The first source 914 and the first drain 916 of the PFET transistor above the PFET portion can be isolated from the semiconductor substrate 600 by the dielectric layer 810, thereby reducing the parasite capacitance between the first source 914 and the semiconductor substrate 600 or between the first drain 916 and the semiconductor substrate 600, and therefore the performance of the PFET transistor can be enhanced. In addition, the first channel region 918 of the PFET transistor can connect with the semiconductor substrate 600 through the third isolation layer 711. On one hand, the third isolation layer 711 can be made of a semiconductor material having good thermal conductivity, which can transport the heat generated in the first channel region 918 to the semiconductor substrate 600, thereby preventing the PFET transistor from accumulating heat and enhancing performance of the transistor. On the other hand, the first channel region 918 can be P-doped, whereas the first isolation layer 711 can be N-doped. These two layers can contact to form a PN junction, thereby forming electrical isolation between the first channel region 918 and the semiconductor substrate 600.

The second source 924 and the second drain 926 of the NFET transistor above the NFET portion can be isolated from the semiconductor substrate 600 by the dielectric layer 810, thereby reducing the parasite capacitance between the second source 924 and the semiconductor substrate or the second drain 926 and the semiconductor substrate 600, and therefore the performance of the NFET transistor can be enhanced. In addition, the second channel region 928 of the NFET transistor can connect with the semiconductor substrate 600 through the forth isolation layer 712. On one hand, the forth isolation layer 712 can be made of a semiconductor material having good thermal conductivity, which can transport the heat generated in the second channel region 928 to the semiconductor substrate 600, thereby preventing the NFET transistor from accumulating heat and enhancing performance of the transistor. On the other hand, the second channel region 928 can be N-doped, whereas the second isolation layer 712 can be P-doped. These two layers can contact to form a PN junction, thereby forming electrical isolation between the second channel region 928 and the semiconductor substrate 600.

The NFET transistor and the PFET transistor can also be isolated from each other by the dielectric layer 810.

The disclosed fabrication method for the junctionless transistors and CJLTs can improve thermal stability of the transistor device and reduce the parasite capacitance and short-channel effects.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a complementary junctionless transistor device comprising:
   providing a semiconductor substrate, wherein the semiconductor substrate includes an N-field-effect transistor (NFET) portion and a P-field-effect transistor (PFET) portion neighboring with each other;
   forming an isolation layer on the semiconductor substrate and an active layer on the isolation layer, wherein the active layer and the isolation layer are made of materials having an etching selectivity, and the semiconductor substrate and the isolation layer are made of materials having an etching selectivity;
   forming a P-well in the NFET portion of the semiconductor substrate, and forming an N-well in the PFET portion of the semiconductor substrate;
   forming a P-doped isolation layer by doping a portion of the isolation layer on the NFET portion, and forming an N-doped isolation layer by doping a portion of the isolation layer on the PFET portion neighboring with the NFET portion;
   forming an N-doped active layer by doping a portion of the active layer on the P-doped isolation layer, and forming a P-doped active layer by doping a portion of the active layer on the N-doped isolation layer;
   etching the active layer and the isolation layer to form an opening to expose a surface of the semiconductor substrate covering an interface portion between the NFET portion and PFET portion;
   removing a portion of the P-doped isolation layer to suspend the N-doped active layer from opposing ends of the N-doped active layer, and removing a portion of the N-doped isolation layer to suspend the P-doped active layer from opposing ends of the P-doped active layer;
   forming a dielectric layer between the N-doped active layer and the semiconductor substrate, between the P-doped active layer and the semiconductor substrate, and in the opening;
   forming a first gate structure on the N-doped active layer disposed on a remaining P-doped isolation layer on the NFET portion, forming a second gate structure on the P-doped active layer disposed on a remaining N-doped isolation layer on the PFET portion; and
   forming an N-doped source and an N-doped drain in the N-doped active layer on both sides of the first gate structure, and forming a P-doped source and a P-doped drain in the P-doped active layer on both sides of the second gate structure.

2. The method of claim 1, wherein removing the portion of the P-doped isolation layer to suspend the N-doped active layer, and removing the portion of the N-doped isolation layer to suspend the P-doped active layer includes:
   forming a photoresist layer on the N-doped active layer and P-doped active layer, wherein the photoresist layer covers the interface portion between the N-doped active layer and P-doped active layer; and
   using a selective etching process to etch inward from the opposing ends of each of the P-doped isolation layer and the N-doped isolation layer such that etched sidewalls of each of the P-doped isolation layer and N-doped isolation layer are aligned with or within corresponding sidewalls of the photoresist layer, and are aligned with or within corresponding sidewalls of the interface portion between the N-doped active layer and P-doped active layer.

3. The method of claim 2, wherein the selective etching process includes a chemical vapor etching process.

4. The method of claim 2, wherein the selective etching process includes a temperature ranging from about 300° C. to about 800° C., and an etching gas including a mixture of $H_2$ and HCl, wherein a partial pressure of HCl is about 300 Torr to about 500 Torr.

5. The method of claim 1, wherein the isolation layer is made of SiGe or GaAs.

6. The method of claim 1, wherein the active layer is made of Si or Ge.

7. A method for forming a complementary junctionless transistor device comprising:
   providing a semiconductor substrate, wherein the semiconductor substrate includes an N-field-effect transistor (NFET) portion and a P-field-effect transistor (PFET) portion neighboring with each other;
   forming an isolation layer on the semiconductor substrate and an active layer on the isolation layer, wherein the active layer is made of a group III-V compound;
   forming a P-well in the NFET portion of the semiconductor substrate, and forming an N-well in the PFET portion of the semiconductor substrate;
   forming a P-doped isolation layer by doping a portion of the isolation layer on the NFET portion, and forming an N-doped isolation layer by doping a portion of the isolation layer on the PFET portion neighboring with the NFET portion;

forming an N-doped active layer by doping a portion of the active layer on the P-doped isolation layer, and forming a P-doped active layer by doping a portion of the active layer on the N-doped isolation layer;

etching the active layer and the isolation layer to form an opening to expose a surface of the semiconductor substrate covering an interface portion between the NFET portion and PFET portion;

removing a portion of the P-doped isolation layer to suspend the N-doped active layer from opposing ends of the N-doped active layer, and removing a portion of the N-doped isolation layer to suspend the P-doped active layer from opposing ends of the P-doped active layer;

forming a dielectric layer between the N-doped active layer and the semiconductor substrate, between the P-doped active layer and the semiconductor substrate, and in the opening;

forming a first gate structure on the N-doped active layer disposed on a remaining P-doped isolation layer on the NFET portion, forming a second gate structure on the P-doped active layer disposed on a remaining N-doped isolation layer on the PFET portion; and forming an N-doped source and an N-doped drain in the N-doped active layer on both sides of the first gate structure, and forming a P-doped source and a P-doped drain in the P-doped active layer on both sides of the second gate structure.

8. The method of claim 1, wherein each of the source and the drain has a doping concentration greater than 2E19 atoms/$cm^3$.

9. The method of claim 1, wherein the dielectric layer is made of a material including silicon oxide, silicon nitride oxide, boron-doped glass, phosphorus-doped glass, boron- and phosphorus-doped glass, or a combination thereof.

* * * * *